US008436331B2

(12) United States Patent
Iwakaji et al.

(10) Patent No.: US 8,436,331 B2
(45) Date of Patent: May 7, 2013

(54) MEMORY DEVICE AND METHOD FOR MANUFACTURING SAME

(75) Inventors: Yoko Iwakaji, Kanagawa-ken (JP); Jun Hirota, Kanagawa-ken (JP); Kyoichi Suguro, Kanagawa-ken (JP); Moto Yabuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 12/844,374

(22) Filed: Jul. 27, 2010

(65) Prior Publication Data
US 2011/0193049 A1 Aug. 11, 2011

(30) Foreign Application Priority Data

Feb. 9, 2010 (JP) ................................. 2010-026399

(51) Int. Cl.
*H01L 21/02* (2006.01)

(52) U.S. Cl.
USPC ............... 257/4; 257/2; 257/5; 257/E21.003; 257/E45.002

(58) Field of Classification Search ............. 257/2, 4–5; 438/382
See application file for complete search history.

(56) References Cited

U.S. PATENT DOCUMENTS

| 7,618,850 | B2 | 11/2009 | Kumar et al. |
| 7,767,499 | B2 | 8/2010 | Herner |
| 7,830,694 | B2 | 11/2010 | Herner |
| 8,003,477 | B2 | 8/2011 | Herner |
| 8,018,024 | B2 | 9/2011 | Herner |
| 2008/0273370 | A1* | 11/2008 | Keller et al. ............... 365/148 |
| 2009/0146131 | A1* | 6/2009 | Happ ................................. 257/5 |
| 2009/0230379 | A1* | 9/2009 | Klostermann et al. ............ 257/5 |
| 2010/0032642 | A1* | 2/2010 | Park et al. .......................... 257/4 |
| 2010/0321979 | A1 | 12/2010 | Yasutake et al. |
| 2010/0327253 | A1* | 12/2010 | Nakai et al. ....................... 257/4 |
| 2011/0068314 | A1* | 3/2011 | Takahashi et al. ................. 257/4 |
| 2011/0227025 | A1 | 9/2011 | Hirota et al. |
| 2011/0233507 | A1 | 9/2011 | Sonehara et al. |
| 2012/0145986 | A1 | 6/2012 | Yasutake |

FOREIGN PATENT DOCUMENTS

| JP | 2009-21602 | 1/2009 |
| WO | WO 2009/005614 A2 | 1/2009 |
| WO | WO 2009/005699 A1 | 1/2009 |

OTHER PUBLICATIONS

U.S. Appl. No. 13/052,143, filed Mar. 21, 2011, Iwakaji, et al.
U.S. Appl. No. 12/873,604, filed Sep. 1, 2010, Iwakaji, et al.
Japanese Office Action issued on Jul. 13, 2012, in Japanese Patent Application No. 2010-026399 filed Feb. 9, 2010 (with English Translation).

* cited by examiner

*Primary Examiner* — A. Sefer
(74) *Attorney, Agent, or Firm* — Oblon, Spivak, McClelland, Maier & Neustadt, L.L.P.

(57) ABSTRACT

According to one embodiment, a method for manufacturing a memory device is disclosed. The method includes forming a silicon diode. At least an upper portion of the silicon diode is made of a semiconductor material containing silicon and doped with impurity. The method includes forming a metal layer made of a metal on the silicon diode. The method includes forming a metal nitride layer made of a nitride of the metal on the metal layer. The method includes forming a resistance change film. In addition, the method includes reacting the metal layer with the silicon diode and the metal nitride layer by heat treatment to form an electrode film containing the metal, silicon, and nitrogen.

6 Claims, 13 Drawing Sheets

TITANIUM LAYER
THICKNESS: 1.0nm

TITANIUM LAYER
THICKNESS: 1.5nm

TITANIUM LAYER
THICKNESS: 3.0nm

MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-026399, filed on Feb. 9, 2010; the entire contents of which are incorporated herein by reference.

FIELD

Embodiments described herein relate generally to a memory device and a method for manufacturing the same.

BACKGROUND

It has recently been discovered that a specific metal oxide material under application of a voltage exhibits two states, i.e., low-resistance state and high-resistance state, depending on the resistivity before the voltage application and the magnitude of the applied voltage, and a novel memory device based on that phenomenon is drawing attention. This memory device is called ReRAM (resistance random access memory). As an actual device structure for the ReRAM, in view of increasing the integration density, a three-dimensional cross-point structure is proposed, in which a memory cell is located at each intersection between WL (word line) and BL (bit line) (for instance, refer to JP-A 2009-021602 (Kokai)).

In the three-dimensional cross-point structure, when a voltage is applied to write data to a memory cell, a reverse voltage is applied also to other non-selected memory cells. Hence, each memory cell needs to be provided with a diode in conjunction with a resistance change film. The diode is, for instance, a PIN silicon diode in which a P-type silicon layer doped with an acceptor, an I-type silicon layer not doped with impurity, and an N-type silicon layer doped with a donor are stacked. Furthermore, an electrode film is provided on the silicon diode. To reduce the contact resistance between the silicon diode and the electrode film, the electrode film is formed from a metal silicide.

However, in a ReRAM having such a structure, the contact resistance between the silicon diode and the electrode film needs to be further reduced so that a sufficiently high forward current can be ensured despite the downscaling of the memory cell.

DETAILED DESCRIPTION

In general, according to one embodiment, a memory device includes a silicon diode, an electrode film, and a resistance change film. The silicon diode, at least an upper portion of the silicon diode is made of a semiconductor material containing silicon and doped with impurity. The electrode film is provided on the silicon diode, is in contact with the silicon diode, and contains a metal, silicon, and nitrogen. The resistance change film is provided below the silicon diode or above the electrode film. The electrode film has higher silicon concentration in a lower surface of the electrode film than in an upper surface of the electrode film, and has higher nitrogen concentration in the upper surface than in the lower surface.

According to another embodiment, a method for manufacturing a memory device is disclosed. The method includes forming a silicon diode. At least an upper portion of the silicon diode is made of a semiconductor material containing silicon and doped with impurity. The method includes forming a metal layer made of a metal on the silicon diode. The method includes forming a metal nitride layer made of a nitride of the metal on the metal layer. The method includes forming a resistance change film. In addition, the method includes reacting the metal layer with the silicon diode and the metal nitride layer by heat treatment to form an electrode film containing the metal, silicon, and nitrogen.

According to still another embodiment, a method for manufacturing a memory device is disclosed. The method includes forming a silicon diode. At least an upper portion of the silicon diode is made of a semiconductor material containing silicon and doped with impurity. The method includes forming a metal layer made of a metal-rich metal nitride on the silicon diode. The method includes forming a metal nitride layer made of a nitride of the metal on the metal layer. The method includes forming a resistance change film. In addition, the method includes reacting the metal layer with the silicon diode and the metal nitride layer by heat treatment to form an electrode film containing the metal, silicon, and nitrogen.

Embodiments of the invention will now be described with reference to the drawings.

A first embodiment of the invention is first described.

Figure 1:
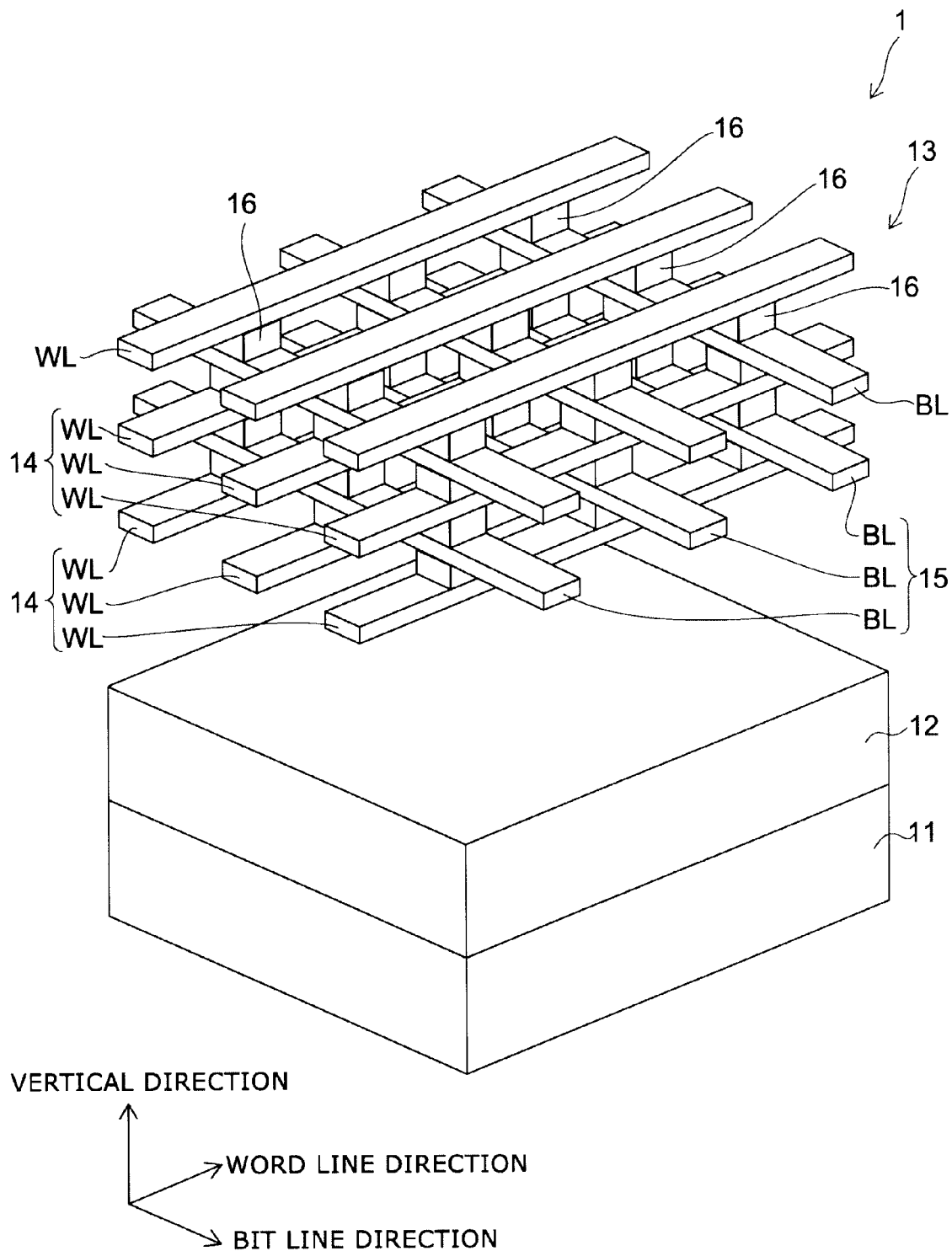
FIG. 1 is a perspective view illustrating a memory device according to a first embodiment.

FIG. 1 is a perspective view illustrating a memory device according to this embodiment.

Figure 2:
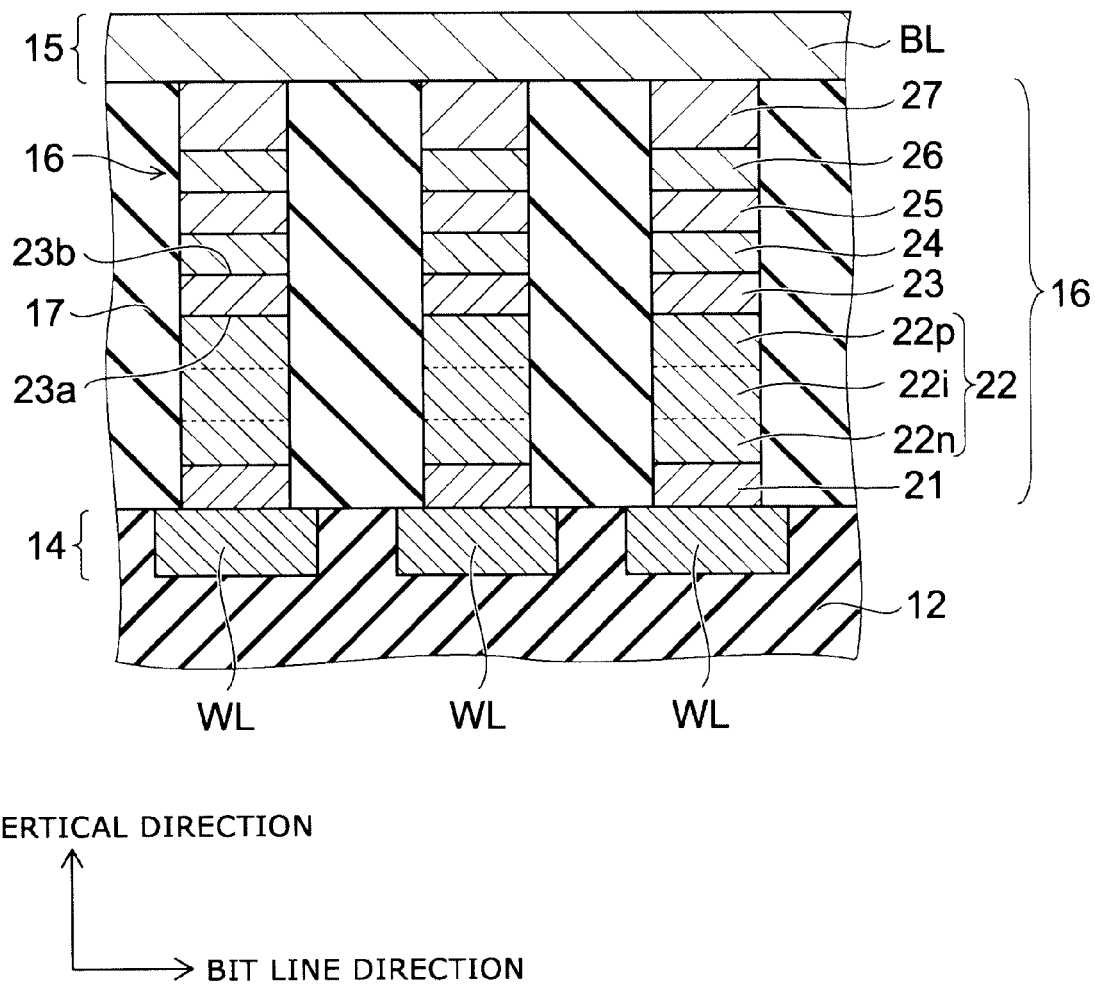
FIG. 2 is a sectional view illustrating one pillar and its surroundings in the first embodiment.

FIG. 2 is a sectional view illustrating one pillar and its surroundings in this embodiment.

The memory device according to this embodiment is a ReRAM.

First, the characteristic features of this embodiment are outlined.

In the memory device according to this embodiment, a pillar is connected between a bit line and a word line and serves as a memory cell. Each pillar includes a resistance change film and a silicon diode, and an electrode film is provided on the silicon diode. The electrode film needs to be formed from a material having low resistance in itself, good compatibility with silicon, and low contact resistance with the silicon diode. Thus, typically, a metal is deposited on the silicon diode and reacted therewith by low-temperature heat treatment to form a metal silicide layer. Furthermore, the electrode film is formed as thin as possible to suppress the series resistance of the electrode film itself and to decrease the height of the pillar.

However, the inventors' investigation has revealed that if a thin metal silicide layer is formed on the silicon diode, the metal silicide is aggregated and granulated like islands by the subsequent high-temperature heat treatment for activating impurity in the silicon diode, and silicon having low impurity concentration is precipitated between the metal silicide grains. It is considered that this is because the metal has strong coupling to the impurity, hence takes in a large amount of impurity in silicon when reacting with silicon, and does not eject much impurity when precipitating silicon. The ejection of silicon having low impurity concentration results in increasing the contact resistance between the silicon diode and the electrode film.

Thus, in this embodiment, nitrogen is introduced into the metal silicide layer to form an electrode film from a compound made of a metal, silicon, and nitrogen. This can prevent aggregation of the electrode film. However, if active nitrogen is directly brought into contact with the silicon diode in forming such an electrode film, a high-resistance silicon nitride layer (SiN layer) is formed between the silicon diode and the electrode film and contrarily increases the contact resistance. Thus, in this embodiment, a metal layer free from nitrogen is first formed on the silicon diode, a metal nitride layer is formed on this metal layer, and then low-temperature heat treatment is performed.

Thus, silicon in the silicon diode is diffused from the lower surface side of the metal layer into the metal layer, and nitrogen in the metal nitride layer is diffused from the upper surface side of the metal layer into the metal layer, so that nitrogen, the metal, and silicon are reacted to form a metal SiN film (intermediate electrode film). Thus, in forming the metal SiN film (intermediate electrode film), while preventing active nitrogen from being in contact with the silicon diode to form a silicon nitride layer, nitrogen is diffused entirely into the metal layer to also suppress formation of a metal silicide layer, which is prone to aggregation. Consequently, silicon having low impurity concentration is not precipitated at the interface between the silicon diode and the electrode film, and the contact resistance between the silicon diode and the electrode film can be reduced. Here, the electrode film thus formed is made of a compound of the metal, silicon, and nitrogen, and its composition is graded in the film thickness direction, with the silicon concentration in the electrode film increasing toward the bottom, and the nitrogen concentration increasing toward the top.

Next, the memory device according to this embodiment is described in detail.

In this embodiment, titanium (Ti) is used as the metal for forming the electrode film on the silicon diode described above.

As shown in FIG. 1, the memory device 1 according to this embodiment includes a silicon substrate 11. A driver circuit (not shown) for the memory device 1 is formed in the upper portion and on the upper surface of the silicon substrate 11. An interlayer insulating film 12 illustratively made of silicon oxide is provided on the silicon substrate 11 so as to bury the driver circuit, and a memory cell section 13 is provided on the interlayer insulating film 12.

In the memory cell section 13, word line wiring layers 14 each including a plurality of word lines WL extending in one direction (hereinafter referred to as "word line direction") parallel to the upper surface of the silicon substrate 11, and bit line wiring layers 15 each including a plurality of bit lines BL extending in a direction (hereinafter referred to as "bit line direction") being parallel to the upper surface of the silicon substrate 11 and crossing, such as being orthogonal to, the word line direction, are alternately stacked via insulating layers. The word line WL and the bit line BL are illustratively formed from tungsten (W). The adjacent word lines W, the adjacent bit lines BL, and the word line WL and the bit line BL are not in contact with each other.

At the nearest point between each word line WL and each bit line BL, a pillar 16 extending in the direction (hereinafter referred to as "vertical direction") perpendicular to the upper surface of the silicon substrate 11 is provided. The pillar 16 is formed between the word line WL and the bit line BL. One pillar 16 constitutes one memory cell. That is, the memory device 1 is a cross-point device in which a memory cell is located at each nearest point between the word line WL and the bit line BL. An interlayer insulating film 17 (see FIG. 2) illustratively made of silicon oxide is buried among the word line WL, the bit line BL, and the pillar 16.

In the following, the configuration of the pillar 16 is described with reference to FIG. 2.

The pillar 16 is one of two kinds of pillars, i.e., a pillar with the word line WL located therebelow and the bit line BL located thereabove, and a pillar with the bit line BL located therebelow and the word line WL located thereabove. FIG. 2 shows a pillar with the word line WL located therebelow and the bit line BL located thereabove. In this pillar 16, from bottom (word line side) to top (bit line side), a lower electrode film 21, a silicon diode 22, an intermediate electrode film 23, a barrier metal 24, a resistance change film 25, a barrier metal 26, and an upper electrode film 27 are stacked in this order. The lower electrode film 21 is in contact with the word line WL, and the upper electrode film 27 is in contact with the bit line BL.

The lower electrode film 21 is illustratively made of titanium nitride (TiN), and has a film thickness of e.g. 5-10 nm. The resistance change film 25 is illustratively formed from a metal oxide and can assume two or more resistance levels, and the resistance value can be switched in response to input of a prescribed electrical signal. The silicon diode 22 is made of polysilicon, and an N-type layer $22n$ having $N^+$-type conductivity, an I-type layer $22i$ made of an intrinsic semiconductor, and a P-type layer $22p$ having $P^+$-type conductivity are stacked therein sequentially from bottom. Thus, the silicon diode 22 passes a current only when a higher potential is supplied to the bit line BL than to the word line WL, with no current passed in the opposite direction. It is noted that in the pillar 16 with the bit line BL located therebelow and the word line WL located thereabove, the stacking order of the N-type layer $22n$, the I-type layer $22i$, and the P-type layer $22p$ in the silicon diode 22 is reversed, but the rest of the stacking structure is similar to that of the aforementioned pillar 16 with the word line WL located therebelow.

The intermediate electrode film 23 illustratively contains titanium, silicon, and nitrogen, and is illustratively formed from a compound made of titanium, silicon, and nitrogen. The composition of the intermediate electrode film 23 is graded in its film thickness direction, with the silicon concentration increasing toward the bottom, and the nitrogen concentration increasing toward the top. Here, the concentration of each component in the intermediate electrode film 23 is not limited to changing monotonically, but the order of concentrations may be partly reversed in midstream. However, overall, the concentration is graded as described above. Thus, the intermediate electrode film 23 has higher silicon concentration in the lower surface 23a than in the upper surface 23b, and has higher nitrogen concentration in the upper surface 23b than in the lower surface 23a. The film thickness of the intermediate electrode film 23 is illustratively 10 nm or less, particularly 1.0-5.0 nm, and more particularly 1.0-3.0 nm. The average composition of the intermediate electrode film 23 can be represented by $TiSi_xN_y$, where x is 0.1-3.0, and y is 0.5-5.0. In the following, this material is simply denoted by "TiSiN".

Next, a method for manufacturing a memory device according to this embodiment is described.

FIGS. 3 to 7 are process sectional views illustrating the method for manufacturing a memory device according to this embodiment.

First, as shown in FIG. 1, a driver circuit for driving the memory cell section 13 is formed in the upper surface of a silicon substrate 11. Next, an interlayer insulating film 12 is formed on the silicon substrate 11. Next, contacts (not shown) reaching the driver circuit are formed in the interlayer insulating film 12.

Figure 3:
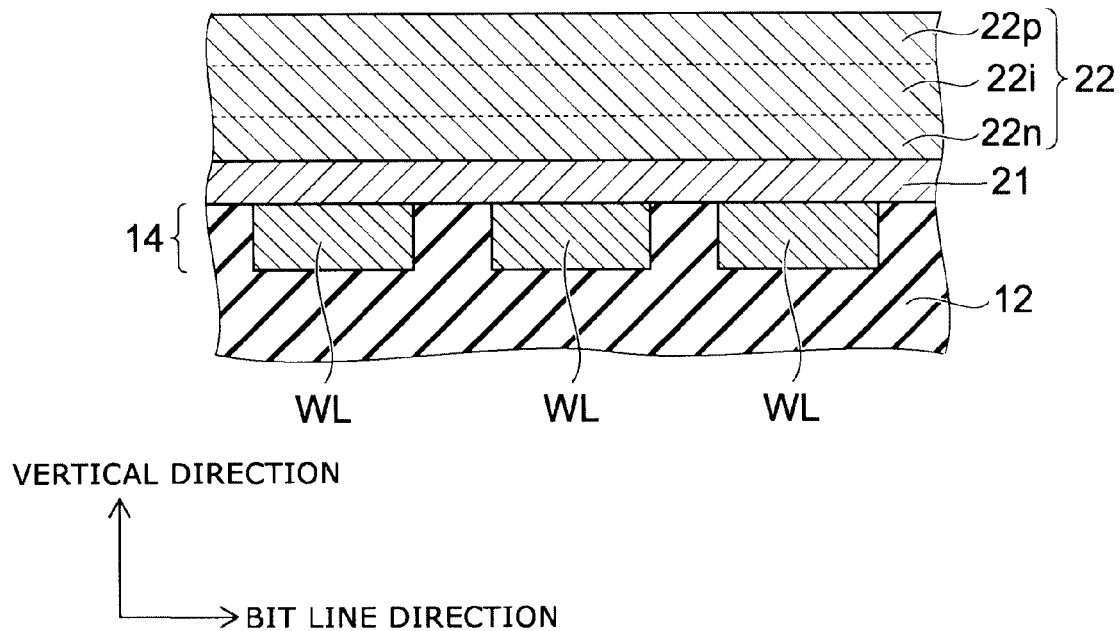
FIGS. 3 to 7 are process sectional views illustrating a method for manufacturing a memory device according to the first embodiment.

Next, as shown in FIG. 3, tungsten is buried in an upper portion of the interlayer insulating film 12 illustratively by a damascene process to form a plurality of word lines WL parallel to each other so as to extend in the word line direction. These word lines WL form a word line wiring layer 14. Next, titanium nitride (TiN) is deposited on the word line wiring layer 14 to a thickness of e.g. 5-10 nm to form a lower electrode film 21. The lower electrode film 21 is a barrier film for suppressing reaction between tungsten forming the word line WL and silicon forming the silicon diode 22.

Next, amorphous silicon is deposited on the lower electrode film 21. At this time, while depositing amorphous silicon, impurities are introduced to continuously form an N-type layer 22n, an I-type layer 22i, and a P-type layer 22p. More specifically, an N-type layer 22n is formed by introducing an impurity serving as a donor for silicon, such as phosphorus (P), while depositing amorphous silicon, an I-type layer 22i is formed by depositing amorphous silicon without introducing impurity, and a P-type layer 22p is formed by introducing an impurity serving as an acceptor for silicon, such as boron (B), while depositing amorphous silicon. Thus, a PIN silicon diode 22 is formed. By way of example, the N-type layer 22n has a film thickness of 2-15 nm and a phosphorus concentration of $1\times10^{20}$–$1\times10^{21}$ cm$^{-3}$, the I-type layer 22i has a film thickness of 50-120 nm, and the P-type layer 22p has a film thickness of 2-15 nm and a boron concentration of $1\times10^{20}$–$2\times10^{21}$ cm$^{-3}$.

Figure 4:
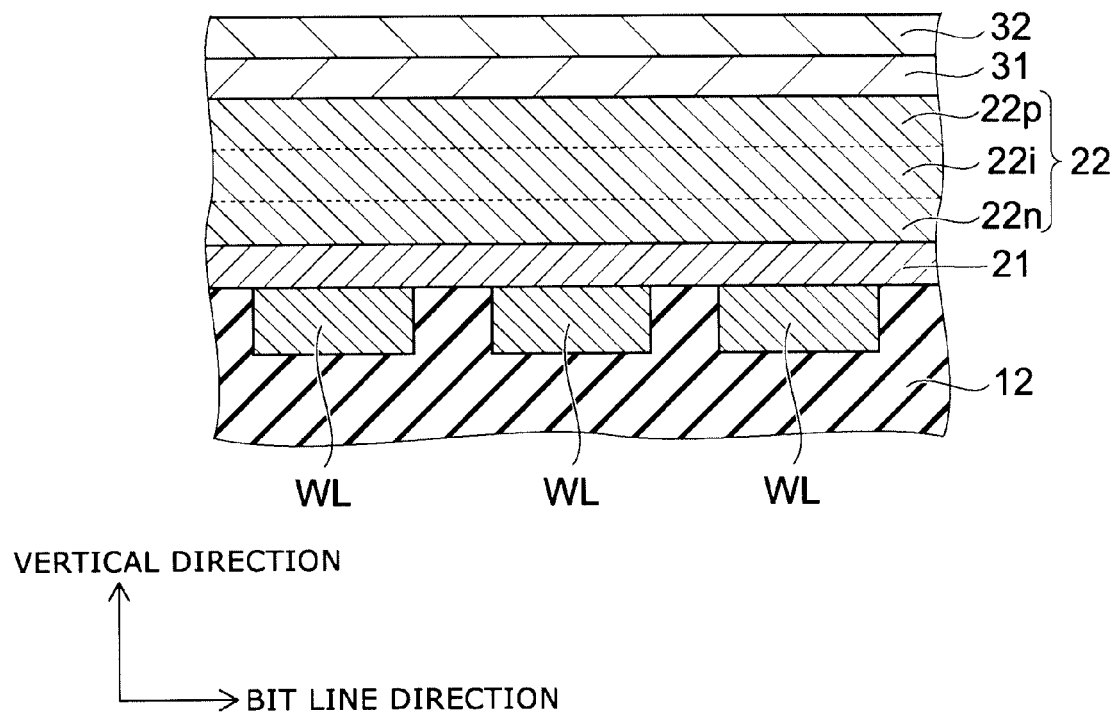

Next, as shown in FIG. 4, a titanium layer 31 made of titanium (Ti) is formed on the silicon diode 22. At this time, the upper surface of the silicon diode 22 is reduced, and the natural oxide film is removed. The titanium layer 31 has a thickness of e.g. 0.5-2 nm. Next, a titanium nitride layer 32 made of titanium nitride (TiN) is formed on the titanium layer 31. The titanium nitride layer 32 has a thickness of e.g. 10 nm.

Figure 5:
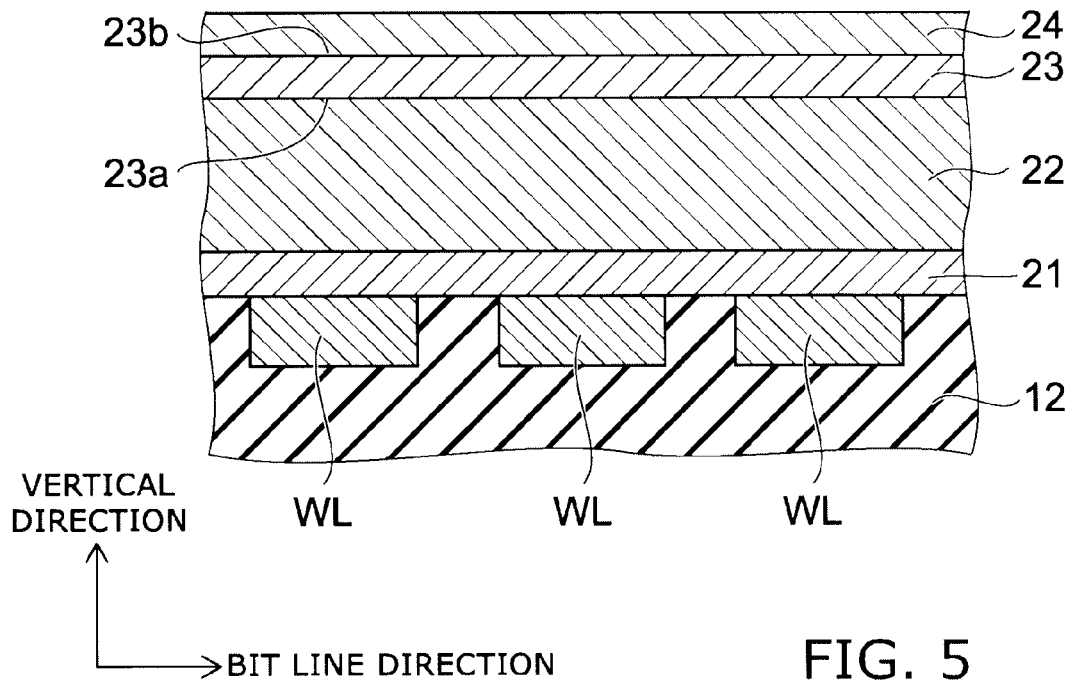

Next, as shown in FIG. 5, heat treatment is performed. For instance, the temperature of this heat treatment is 500-700° C., and more particularly 600° C. The duration is illustratively 1 minute. Thus, into the titanium layer 31, silicon diffuses from the silicon diode 22, and nitrogen diffuses from the titanium nitride layer 32, each reacting with titanium. Consequently, an intermediate electrode film 23 made of TiSiN is formed. In this specification, this heat treatment for forming TiSiN is referred to as "low-temperature heat treatment". The thickness of the intermediate electrode film 23 after the reaction is approximately twice the thickness of the titanium layer 31 before the reaction.

In this low-temperature heat treatment, silicon diffuses from the lower surface 23a side of the intermediate electrode film 23, and nitrogen diffuses from the upper surface 23b side of the intermediate electrode film 23. Hence, the intermediate electrode film 23 has a composition such that the silicon concentration becomes higher toward the lower surface, and the nitrogen concentration becomes higher toward the upper surface. Furthermore, if the titanium layer 31 is formed sufficiently thin, nitrogen reaches the position of the lower surface of the titanium layer 31, and hence no titanium silicide ($TiSi_2$) layer free from nitrogen is formed. Moreover, in this low-temperature heat treatment, nitrogen reaches the silicon diode 22 by diffusing in the intermediate electrode film 23, and hence active nitrogen is not directly brought into contact with the silicon diode 22. Thus, no silicon nitride (SiN) layer is formed on the upper surface of the silicon diode 22. Part of the titanium nitride layer 32 remains also after the reaction as a barrier metal 24 made of titanium nitride (TiN).

Figure 6:
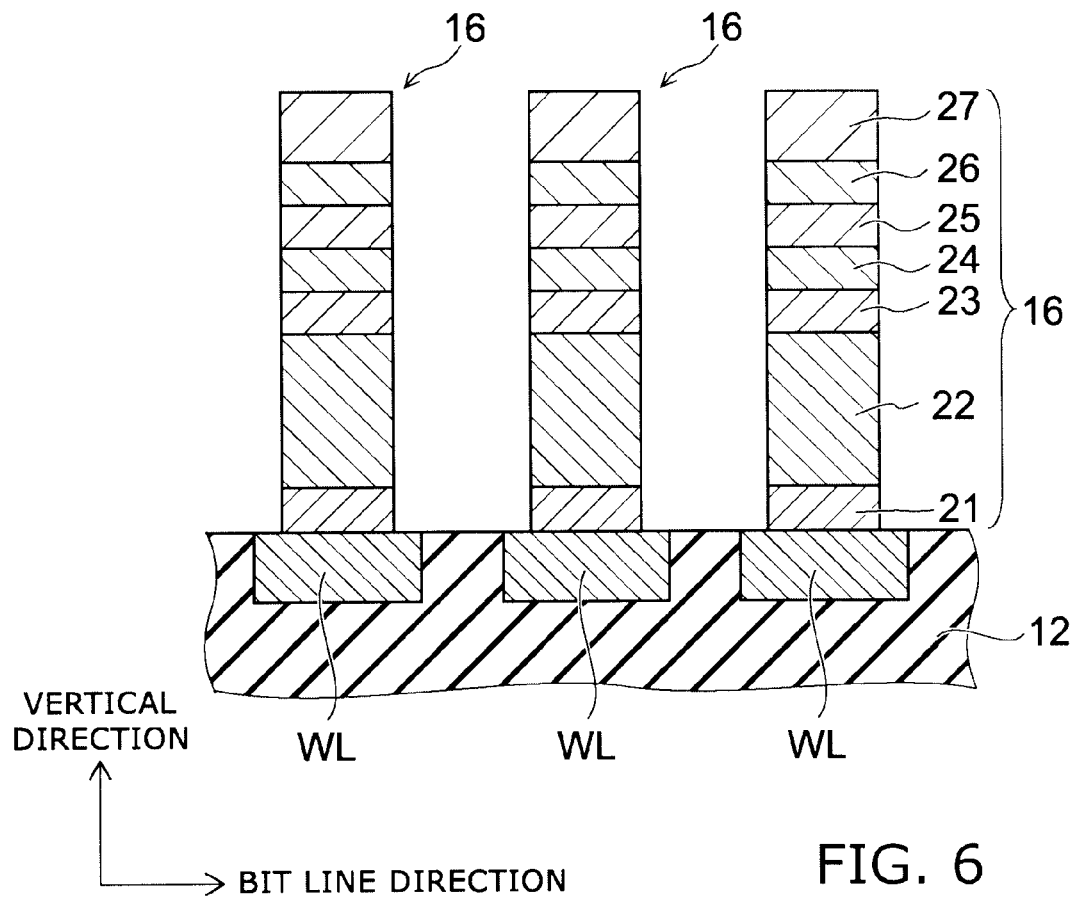

Next, as shown in FIG. 6, a resistance change film 25 is formed on the barrier metal 24. Next, a barrier metal 26 illustratively made of titanium nitride (TiN) is formed. Next, an upper electrode film 27 illustratively made of tungsten is formed. Next, a silicon oxide film, using TEOS (tetraethyl orthosilicate) as a raw material, and a silicon nitride film are formed to form a mask material for patterning, and this mask material is patterned by a lithography process to form a mask pattern (not shown). Next, this mask pattern is used as a mask to perform RIE (reactive ion etching) so that the upper electrode film 27, barrier metal 26, resistance change film 25, barrier metal 24, intermediate electrode film 23, silicon diode 22, and lower electrode film 21 are selectively removed and divided along both the word line direction and the bit line direction. Thus, a plurality of pillars 16 are formed on each word line WL. The aspect ratio of the pillar 16 is illustratively 4 or more.

Figure 7:
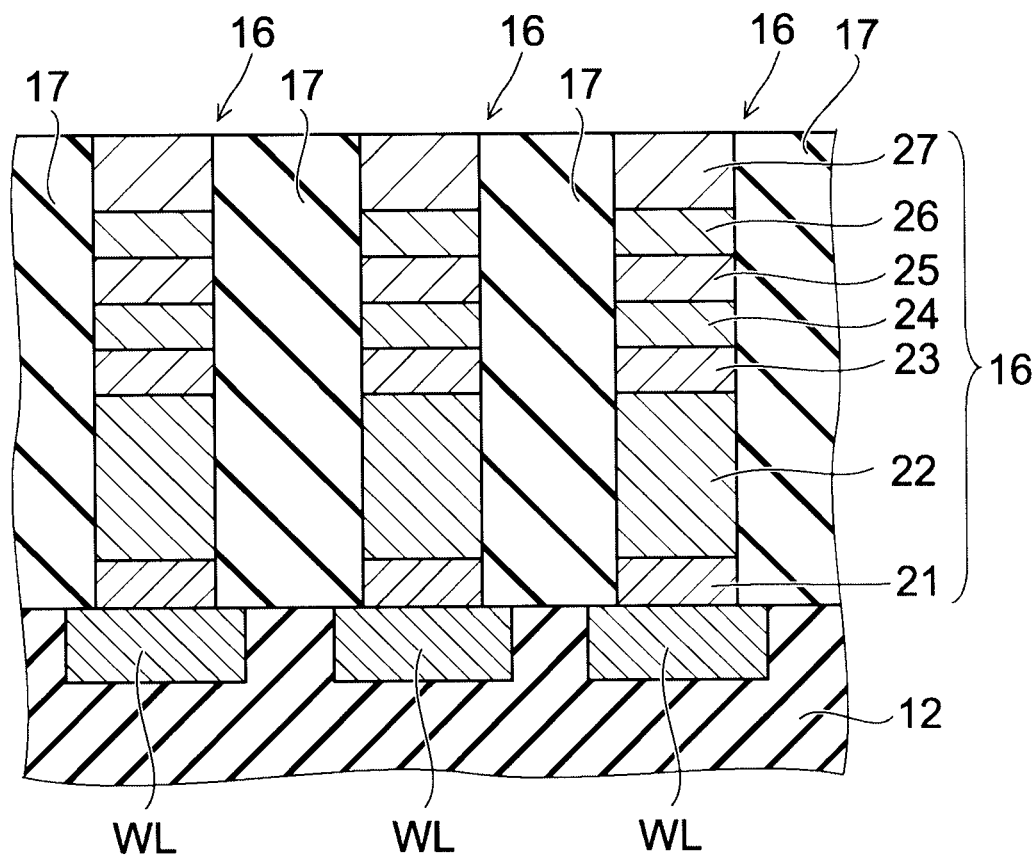

Next, as shown in FIG. 7, for instance, an insulating film, such as a silicon oxide film, is deposited by a CVD (chemical vapor deposition) process using TEOS as a raw material so as to bury the pillars 16. Next, the upper electrode film 27 is used as a stopper to perform CMP (chemical mechanical polishing), thereby planarizing the upper surface of the silicon oxide film. Thus, an interlayer insulating film 17 made of silicon oxide is formed between the pillars 16. At this time, the upper surface of the upper electrode film 27 is exposed at the upper surface of the interlayer insulating film 17.

Next, as shown in FIG. 2, another interlayer insulating film (not shown) is formed on the interlayer insulating film 17, and bit lines BL are formed by a damascene process. More specifically, a trench is formed in a region of the interlayer insulating film where a bit line BL is to be formed, a wiring material such as tungsten is deposited to fill in the trench, and tungsten deposited outside the trench is removed by CMP. Thus, bit lines BL made of tungsten are formed. These bit lines BL form a bit line wiring layer 15. Each bit line BL is connected to the upper surface of a plurality of pillars 16 arranged in the bit line direction. Thus, each pillar 16 is formed between the word line WL and the bit line BL, and connected to the word line WL and the bit line BL.

Next, pillars 16 are formed on the bit line BL. In forming this pillar 16, the stacking order of the N-type layer 22n, the I-type layer 22i, and the P-type layer 22p in the silicon diode 22 is reversed with respect to the aforementioned pillar 16 formed on the word line WL. Subsequently, by a similar method, a word line wiring layer 14, a plurality of pillars 16, a bit line wiring layer 15, and a plurality of pillars 16 are formed repetitively. Thus, the structure as shown in FIG. 1 is fabricated.

Next, heat treatment is performed at a temperature of e.g. 700-900° C. for a duration of e.g. 3-80 seconds. Thus, silicon forming the silicon diode 22 is crystallized into polysilicon, and the impurity contained in this silicon is activated. In this specification, this heat treatment intended for crystallizing silicon and activating impurity is referred to as "high-temperature heat treatment". Thus, the memory cell section 13 is formed. Consequently, the memory device 1 according to this embodiment is manufactured.

Next, the function and effect of this embodiment are described.

In this embodiment, the process shown in FIG. 4 includes forming a thin titanium layer 31 on the silicon diode 22 and forming a titanium nitride layer 32 thereon, and the process shown in FIG. 5 includes performing low-temperature heat treatment, i.e., heat treatment at a temperature of approximately 500-700° C. Thus, silicon is diffused from the lower surface side of the titanium layer 31, and nitrogen is diffused from the upper surface side thereof, so that an intermediate electrode film 23 made of TiSiN can be formed. At this time, titanium has a larger amount of decrease in the Gibbs free energy associated with oxidation reaction, and a larger amount of heat absorption, than silicon. Thus, titanium is more susceptible to oxidation than silicon. Hence, titanium deposited on the silicon diode 22 reduces the natural oxide film formed on the upper surface of the silicon diode 22 and is coupled to silicon. Thus, good ohmic characteristics can be achieved between the silicon diode 22 and the intermediate electrode film 23. Consequently, the forward current in the pillar 16 increases, allowing a wide margin between the set voltage for turning the resistance change film 25 into the set state and the reset voltage for turning it into the reset state. Hence, the memory device 1 is less prone to malfunctions.

Furthermore, because nitrogen diffused from the titanium nitride layer 32 reaches the lower surface of the titanium layer 31, no titanium silicide (TiSi$_2$) layer free from nitrogen is formed on the silicon diode 22. This also avoids precipitation of silicon having low impurity concentration due to aggregation of such a titanium silicide layer at the time of the subsequent high-temperature heat treatment. Thus, this embodiment can improve the thermal stability of the interface between the silicon diode 22 and the intermediate electrode film 23, and suppress the contact resistance therebetween at a low level. Furthermore, because active nitrogen is not directly brought into contact with the upper surface of the silicon diode 22, no silicon nitride (SiN) layer having high resistance is formed on the upper surface of the silicon diode 22, and hence there is no increase in the contact resistance.

Moreover, part of the titanium nitride layer 32 remains also after the heat treatment as a barrier metal 24. The barrier metal 24 made of titanium nitride (TiN) has good compatibility with the resistance change film 25 made of a metal oxide. Hence, by interposing the barrier metal 24 between the intermediate electrode film 23 and the resistance change film 25, the switching characteristics of the resistance change film 25 can be improved.

In this embodiment, although titanium is illustratively used as the metal forming the intermediate electrode film 23, this metal is not limited to titanium. However, to achieve the effect of reducing the natural oxide film on the upper surface of the silicon diode 22, it is preferably a metal having a larger amount of decrease in the Gibbs free energy associated with oxidation reaction than silicon, or having a larger amount of heat absorption associated with oxidation reaction than silicon. Besides titanium, such a metal is illustratively tantalum (Ta), niobium (Nb), hafnium (Hf), zirconium (Zr), or chromium (Cr), or an alloy of these metals with tungsten (W).

Next, comparative examples and a practical example of this embodiment are described.

A first comparative example of this embodiment is first described.

Figure 8A:
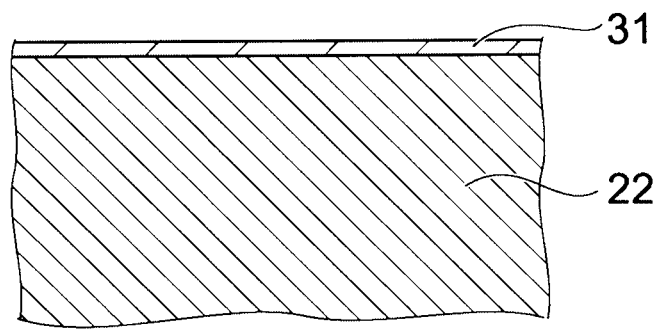
FIGS. 8A to 8C are process sectional views illustrating a method for manufacturing a memory device according to a first comparative example.
Figure 8B:
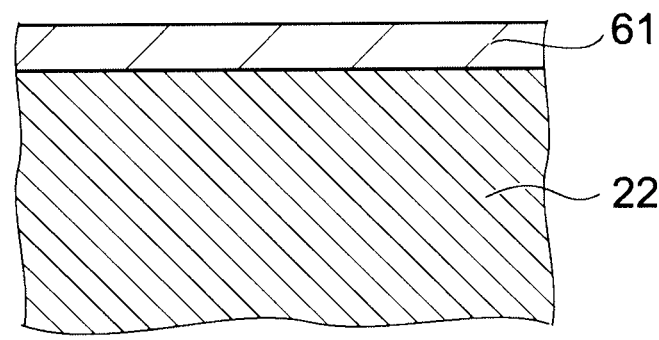
Figure 8C:
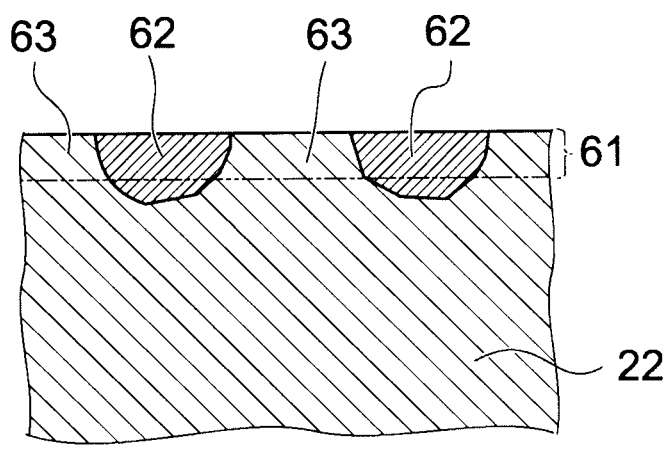

FIGS. 8A to 8C are process sectional views illustrating a method for manufacturing a memory device according to this comparative example.

In this comparative example, the intermediate electrode film is formed from titanium silicide free from nitrogen. More specifically, as shown in FIG. 8A, a titanium layer 31 is formed on the silicon diode 22. Next, as shown in FIG. 8B, by performing low-temperature heat treatment at 500-700° C., silicon in the silicon diode 22 is reacted with titanium in the titanium layer 31 to form a titanium silicide (TiSi$_2$) film 61. Subsequently, after the memory cell section 13 as shown in FIG. 1 is fabricated, high-temperature heat treatment at 700-900° C. is performed to crystallize the silicon diode and activate impurity.

In this case, as shown in FIG. 8C, with this high-temperature heat treatment, the titanium silicide film 61 is aggregated like islands into titanium silicide grains 62. At this time, a silicon portion 63 having low impurity concentration is precipitated in the region located between the titanium silicide grains 62 where the titanium silicide film 61 was present before the aggregation. The impurity concentration of the silicon portion 63 is illustratively $1 \times 10^{19}$ cm$^{-3}$ or less. It is considered that this is because titanium has stronger coupling strength to impurities such as boron and phosphorus than silicon, hence takes in a large amount of impurity when taking in silicon, and does not eject much impurity but leave it in titanium when ejecting silicon. Thus, because the silicon portion 63 having low impurity concentration is precipitated, even if the impurity contained in the silicon portion 63 is electrically activated, sufficient conductivity fails to be achieved, thus significantly increasing the contact resistance between the silicon diode 22 and the intermediate electrode film.

Next, a second comparative example of this embodiment is described.

Figure 9:
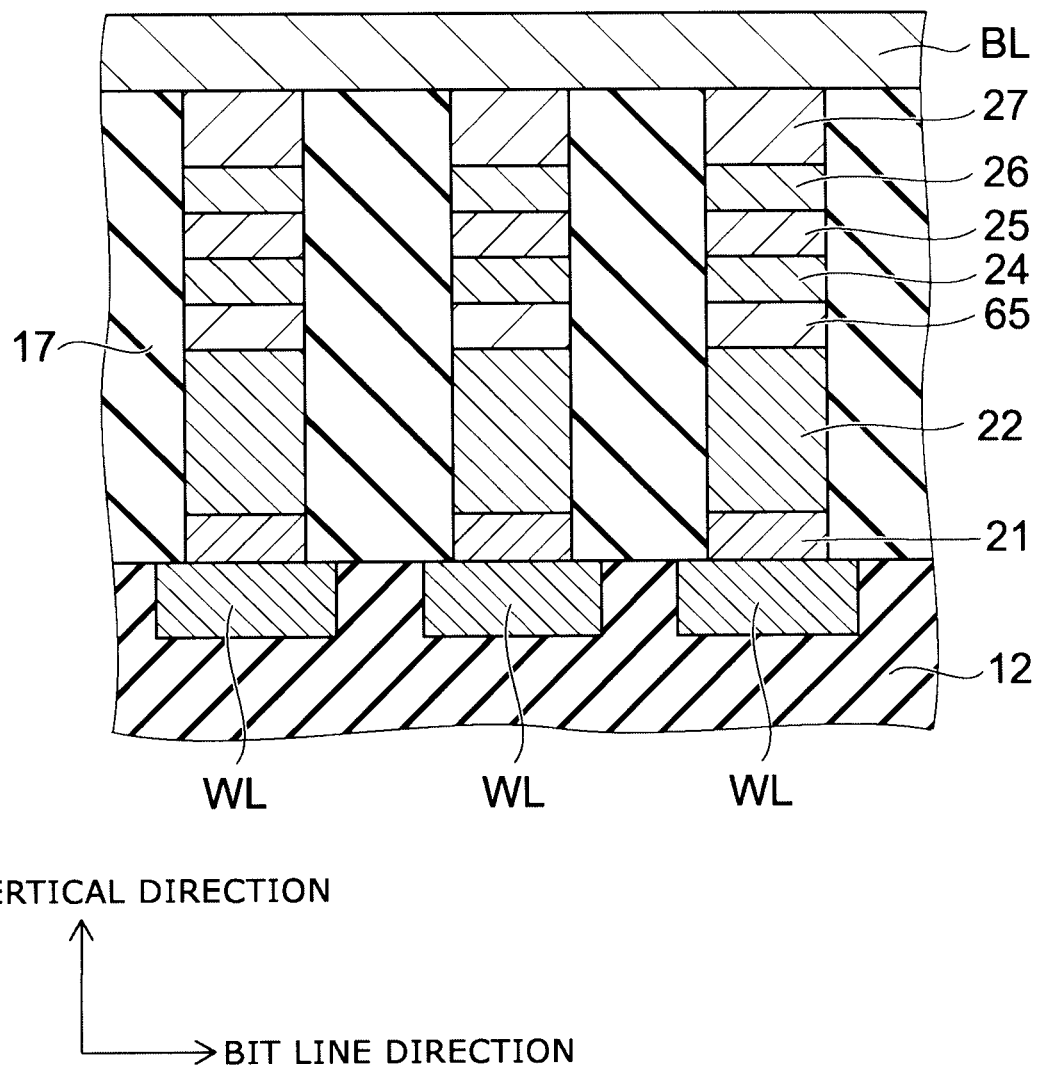
FIG. 9 is a sectional view illustrating a memory device according to a second comparative example.

FIG. 9 is a sectional view illustrating a memory device according to this comparative example.

As shown in FIG. 9, in this comparative example, a TiSiN film 65 is formed on the silicon diode 22 by a sputtering or CVD process. In this case, the TiSiN film 65 has a uniform composition.

In the case where the TiSiN film 65 is formed by a sputtering process, nitrogen gas (N$_2$) and argon gas (Ar) are used as a sputter gas to deposit titanium and silicon on the silicon diode 22. Hence, active nitrogen in the sputter gas directly reaches the silicon diode 22 and results in forming silicon nitride (not shown) layered on the upper surface of the silicon diode 22. This increases the contact resistance because silicon nitride has high resistivity.

In the case where the TiSiN film 65 is formed by a CVD process, a mixed gas of titanium tetrachloride (TiCl$_4$), ammonium ions (NH$_4$), and monosilane (SiH$_4$) is used as a raw material gas. Also in this case, nitrogen in ammonium ions is activated and brought into contact with the silicon diode 22, and hence results in forming silicon nitride on the upper surface of the silicon diode 22. Thus, in this comparative example, a silicon nitride layer is inevitably formed between the silicon diode 22 and the TiSiN film 65 and increases the contact resistance.

Next, a third comparative example of this embodiment is described.

Figure 10:
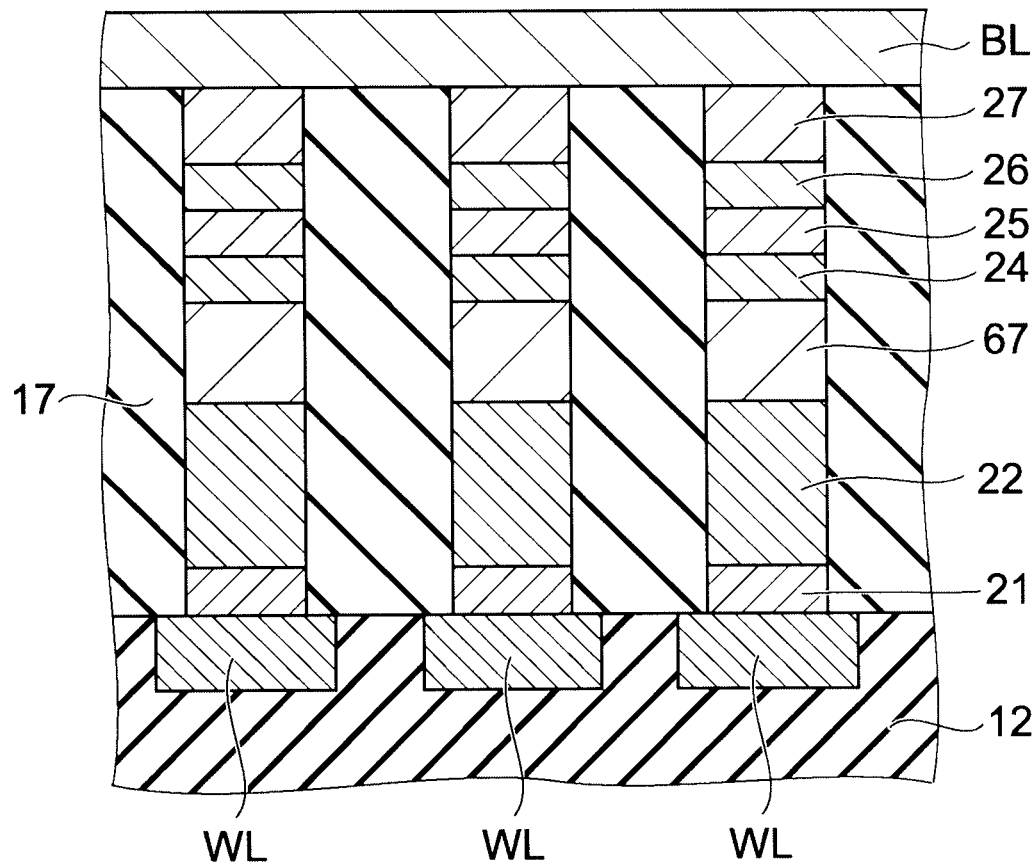
FIG. 10 is a sectional view illustrating a memory device according to a third comparative example.

FIG. 10 is a sectional view illustrating a memory device according to this comparative example.

As shown in FIG. 10, in this comparative example, a thick titanium silicide (TiSi$_2$) layer 67 is formed on the silicon diode 22. If the thickness of the titanium silicide layer 67 is sufficiently thick, such as 20 nm or more, then the titanium silicide layer 67 is less prone to aggregation despite the subsequent high-temperature heat treatment. Such a thick titanium silicide layer 67 can be formed by thickly forming a P-type layer 22p, which is the top layer of the silicon diode 22, forming a thick titanium layer thereon, and then performing a prolonged low-temperature heat treatment. Thus, because of no aggregation of the titanium silicide layer 67, no silicon portion having low impurity concentration is formed. Furthermore, because of no involvement by nitrogen in the process for forming the titanium silicide layer 67, no silicon nitride is formed either.

However, in this comparative example, because the titanium silicide layer 67 is formed thick, the height of the pillar 16 increases. Hence, narrowing the width of the pillar 16 to increase the integration density of memory cells results in increasing the aspect ratio of the pillar 16, which makes it difficult to process the pillar 16. Furthermore, because the titanium silicide layer 67 itself is thick, the series resistance of the titanium silicide layer 67 increases. Moreover, it is necessary to thickly form a P-type layer 22p and a titanium layer, and to perform a prolonged low-temperature heat treatment. This increases the manufacturing cost of the memory device.

Next, a practical example of this embodiment is described.

The configuration of the memory device according to this practical example is similar to that of the above first embodiment.

Figure 11:
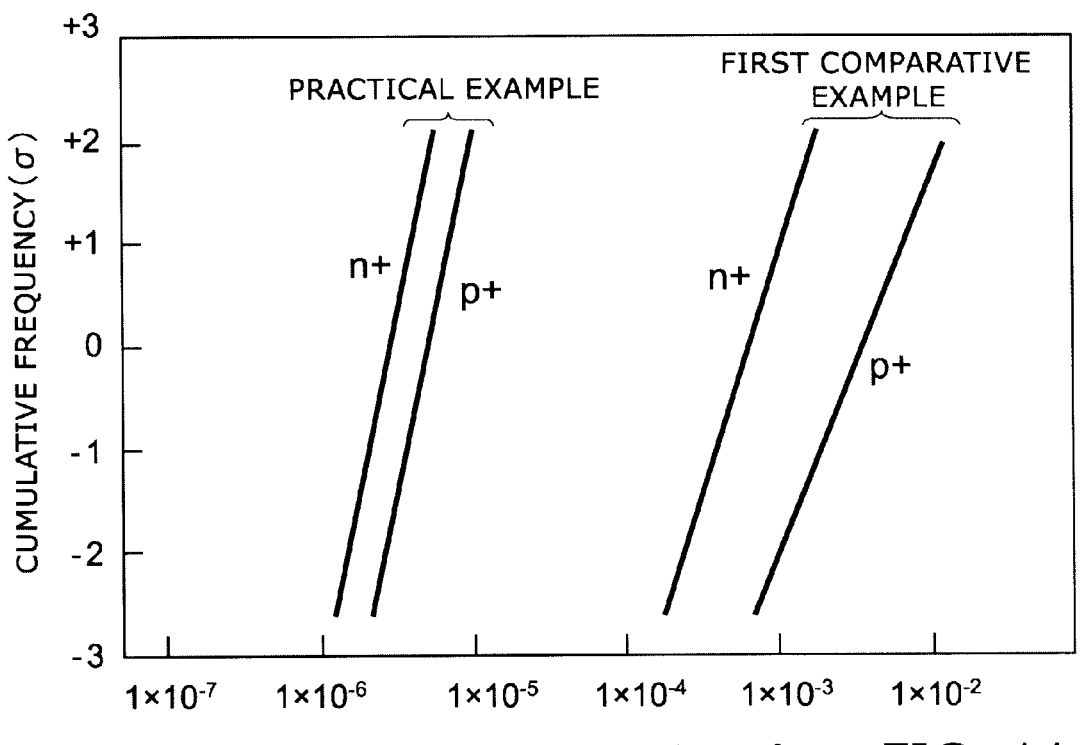
FIG. 11 is a graph illustrating the contact resistance of the memory device according to the practical example and the first comparative example of this embodiment.

FIG. 11 is a graph illustrating the contact resistance of the memory device according to the practical example and the first comparative example of this embodiment, in which the horizontal axis represents the contact resistance between the silicon diode and the intermediate electrode film, and the vertical axis represents cumulative frequency.

In FIG. 11, "n+" indicates the case where the top layer of the silicon diode 22 is the N-type layer 22n, and "p+" indicates the case where the top layer of the silicon diode 22 is the P-type layer 22p.

As shown in FIG. 11, in the practical example of this embodiment, the contact resistance was lower by approximately 2.5 to 3 orders of magnitude than in the above first comparative example. More specifically, in this practical example, the contact resistance was 2×10$^{-5}$ Ωcm$^2$ or less, and thus an interface having good ohmic characteristics was obtained. In contrast, in the first comparative example, the contact resistance was higher than 5×10$^{-5}$ Ωcm$^2$, which resulted in an interface having non-ohmic characteristics. Consequently, in the memory device according to this practical example, the forward current in the pillar 16 was 2.5 times that in the memory device according to the above first comparative example.

Furthermore, if the pillars 16 are formed in an eight-layer structure, and low-temperature heat treatment is performed at the time of forming each layer, then the bottom pillar 16 is subjected eight times to the low-temperature heat treatment. However, in the memory device according to this practical example, no decrease in the forward current was observed despite eight times of heat treatment at a temperature of 750° C. for a duration of 15 seconds. Thus, it turns out that the memory device according to this practical example has higher thermal stability, with no characteristics degradation despite eight times of low-temperature heat treatment.

Next, the influence of the thickness of the titanium layer 31 on the contact resistance of the completed memory device is described.

Figure 12:
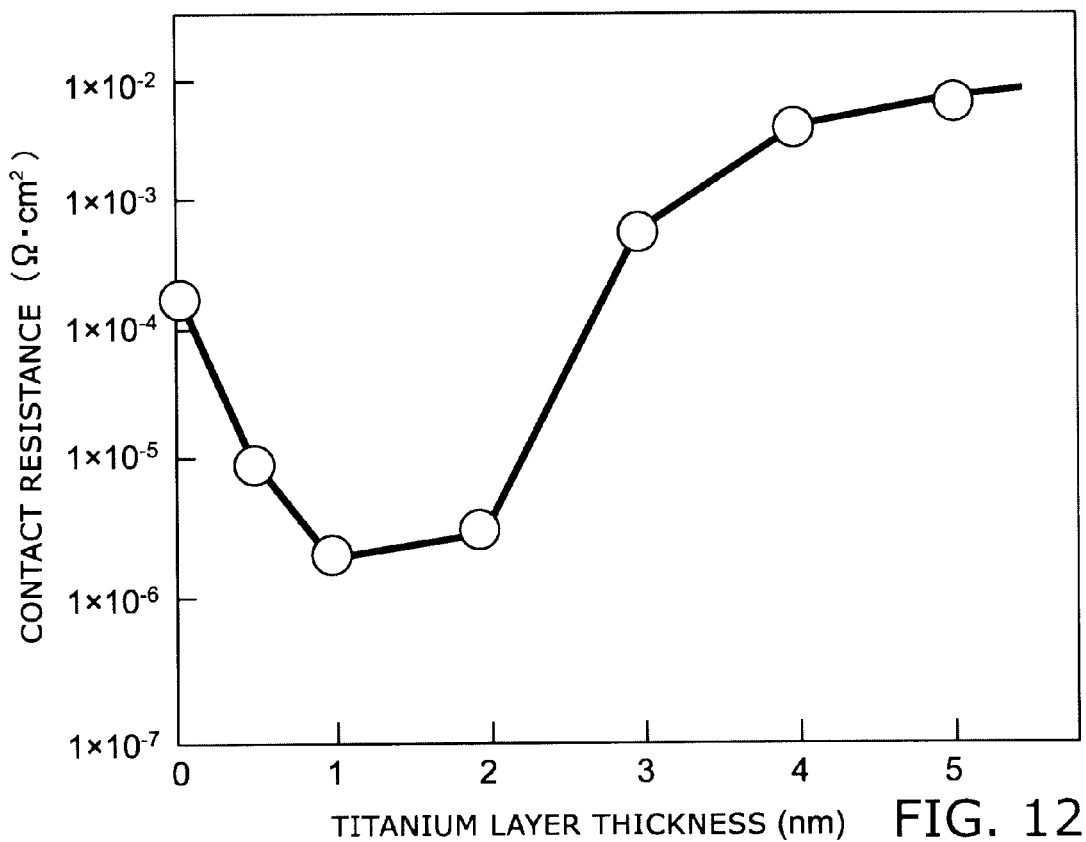
FIG. 12 is a graph illustrating the influence which the thickness of the titanium layer formed on the silicon diode exerts on the contact resistance.

FIG. 12 is a graph illustrating the influence which the thickness of the titanium layer formed on the silicon diode exerts on the contact resistance, in which the horizontal axis represents the thickness of the titanium layer before low-temperature heat treatment, and the vertical axis represents the contact resistance after high-temperature heat treatment.

Figure 13A:
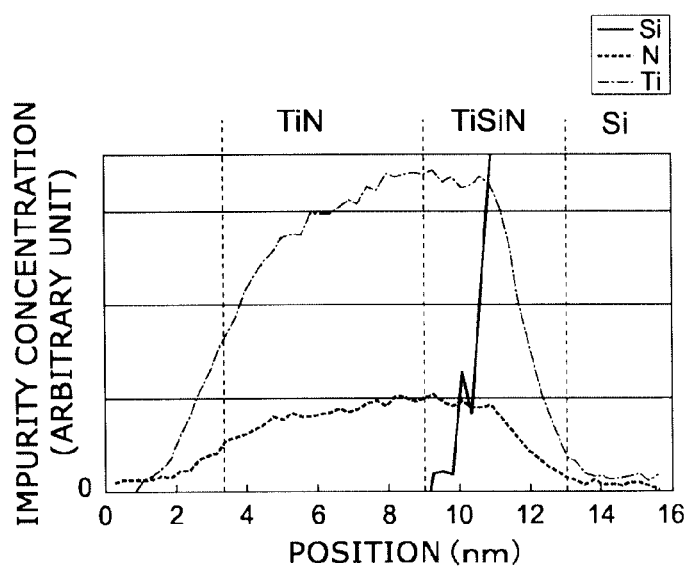
FIGS. 13A to 13C are graphs illustrating the impurity concentration profiles of the intermediate electrode film and its surroundings.
Figure 13B:
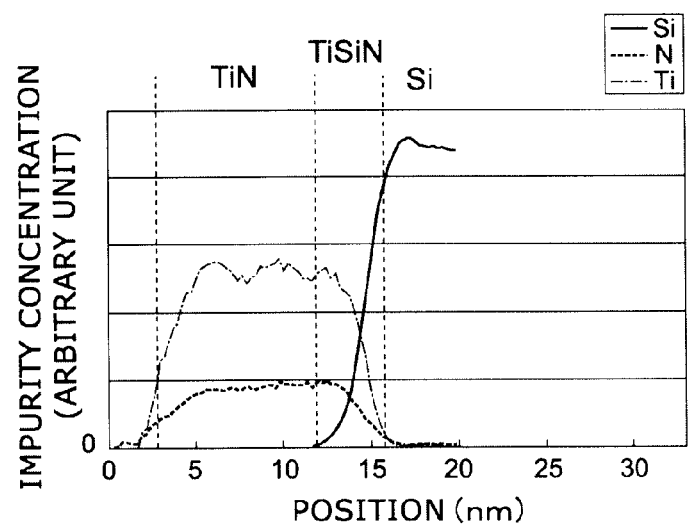
Figure 13C:
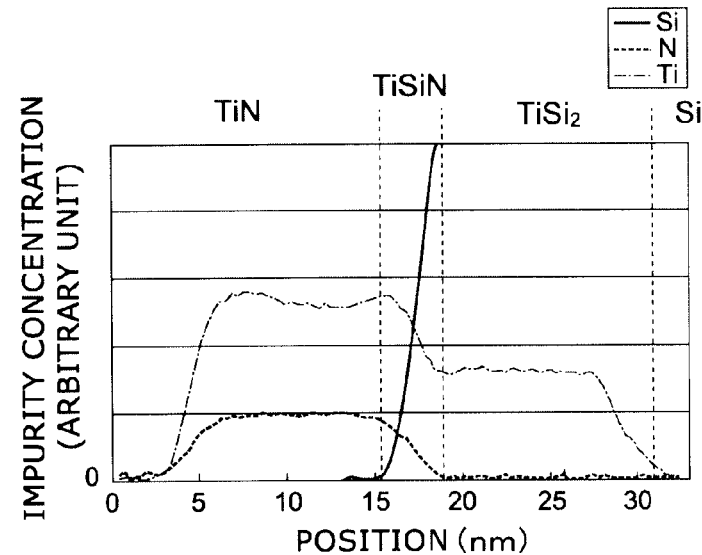

FIGS. 13A to 13C are graphs illustrating the impurity concentration profiles of the intermediate electrode film and its surroundings, in which the horizontal axis represents the vertical position, and the vertical axis represents the impurity concentration.

The profiles shown in FIGS. 13A to 13C are profiles after high-temperature heat treatment. The samples shown in FIGS. 13A to 13C are different in the thickness of the titanium layer 31 before low-temperature heat treatment, in which FIG. 13A shows the case of 1.0 nm, FIG. 13B shows the case of 1.5 nm, and FIG. 13C shows the case of 3.0 nm. The thickness of the titanium nitride layer 32 before low-temperature heat treatment is 10 nm in all cases. The profiles shown in FIGS. 13A to 13C are measured using an EELS (electron energy loss spectroscopy) detector attached to a TEM (transmission electron microscope). That is, the impurity concentration profile of the intermediate electrode film can illustratively be measured using EELS.

As shown in FIG. 12, in the case where the thickness of the titanium layer 31 formed on the silicon diode 22 was 0.5-2.0 nm in the process shown in FIG. 4, the contact resistance was lower than in the case where no titanium layer 31 was formed, i.e., the thickness of the titanium layer 31 was 0 nm, and the case where the thickness of the titanium layer 31 was 3 nm or more. In the case where no titanium layer is formed, it is considered that the titanium nitride layer 32 is directly deposited on the silicon diode 22, allowing active nitrogen contained in the atmosphere for depositing titanium nitride to reach the silicon diode 22 and form a silicon nitride layer, which increases the contact resistance.

In contrast, in the case where the thickness of the titanium layer 31 is 0.5-2.0 nm, as described above, nitrogen contained in the atmosphere for depositing a titanium nitride layer 32 diffuses in the titanium layer 31 and reaches the silicon diode 22. Hence, it is considered that active nitrogen is not in contact with the silicon diode 22, and no silicon nitride (SiN) layer is formed on the silicon diode 22. This can be confirmed by the fact that a layer containing silicon (Si) and nitrogen (N) and not containing titanium (Ti) is not observed in FIGS. 13A and 13B.

On the other hand, in the case where the thickness of the titanium layer 31 was 3 nm or more, as shown in FIG. 13C, in the low-temperature heat treatment, nitrogen (N) did not reach the lower surface of the titanium layer 31, forming a titanium silicide (TiSi$_2$) layer free from nitrogen, which was aggregated in the subsequent high-temperature heat treatment to form titanium silicide grains. Thus, a silicon portion having low impurity concentration was formed between the titanium silicide grains. Here, the profile shown in FIG. 13C shows the result of measurement along a straight line passing through the titanium silicide grain, rather than the silicon portion having low impurity concentration. Thus, the contact resistance was higher than in the case where the thickness of the titanium layer 31 was 0.5-2.0 nm.

In contrast, as shown in FIGS. 13A and 13B, in the case where the thickness of the titanium layer 31 was 0.5-2.0 nm, in the low-temperature heat treatment, nitrogen (N) reached the lower surface of the titanium layer 31, and no titanium silicide layer containing titanium (Ti) and silicon (Si) and not containing nitrogen (N) was formed. Thus, no aggregation of a titanium silicide layer occurred, and no silicon portion having low impurity concentration was formed either. Thus, in the case where the thickness of the titanium layer 31 was 0.5-2.0 nm, neither a silicon nitride layer nor a titanium silicide layer was formed, but only a TiSiN film was formed, achieving a low contact resistance. Here, even in the case where the thickness of the titanium layer 31 is 3 nm or more, if the duration of low-temperature heat treatment is prolonged so that nitrogen reaches the lower surface of the titanium layer 31, then a low contact resistance can be achieved.

Next, a variation of the first embodiment is described.

Figure 14:
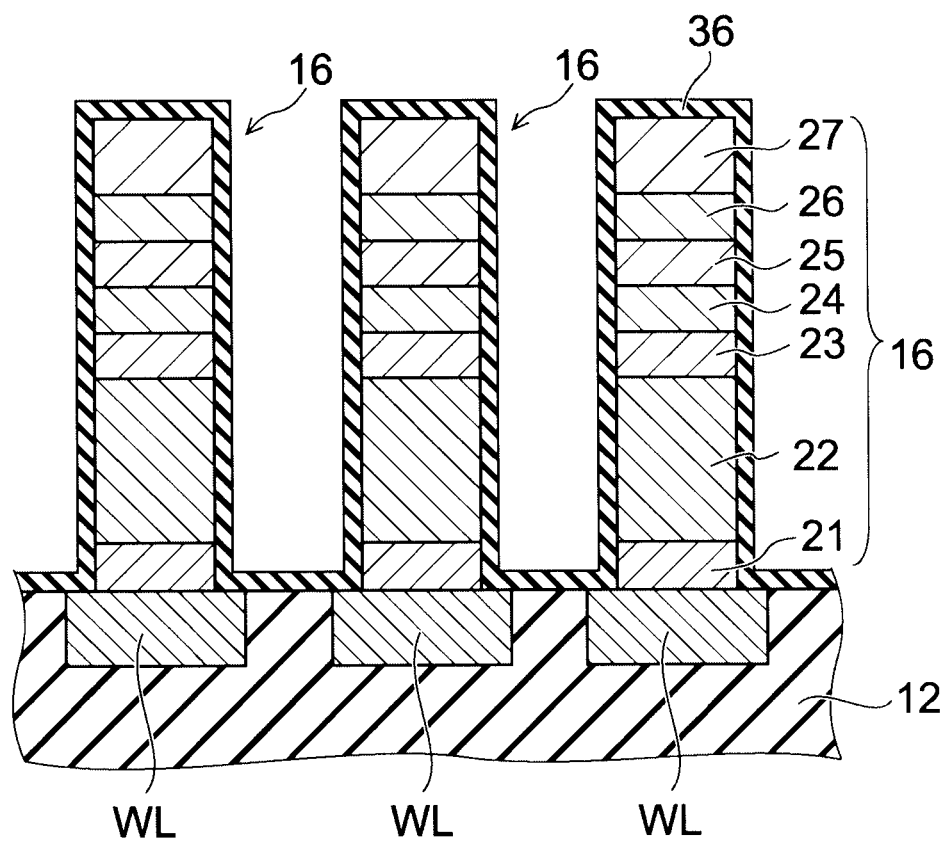
FIGS. 14 to 16 are process sectional views illustrating a method for manufacturing a memory device according to a variation of the first embodiment.
Figure 15:
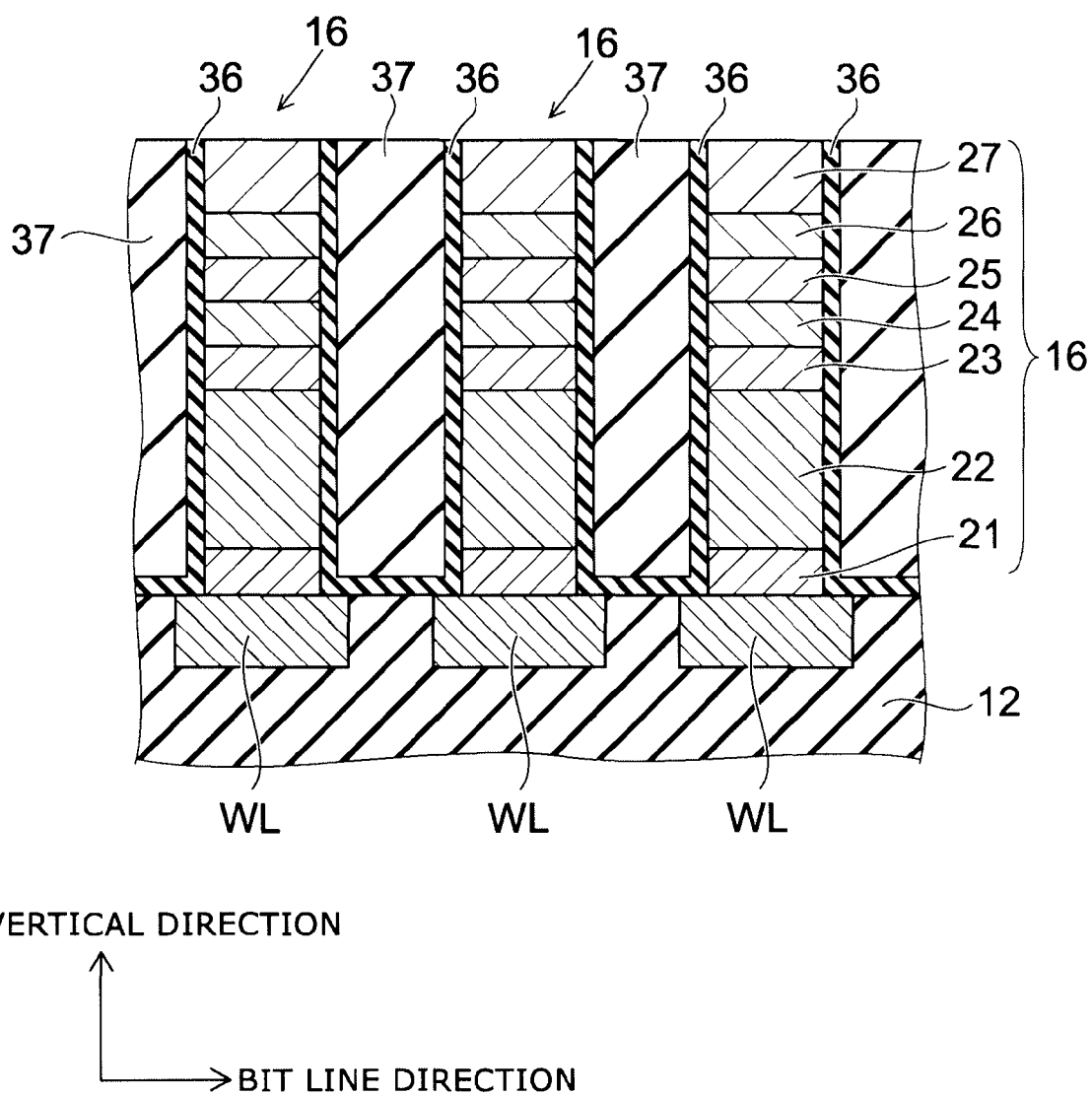
Figure 16:
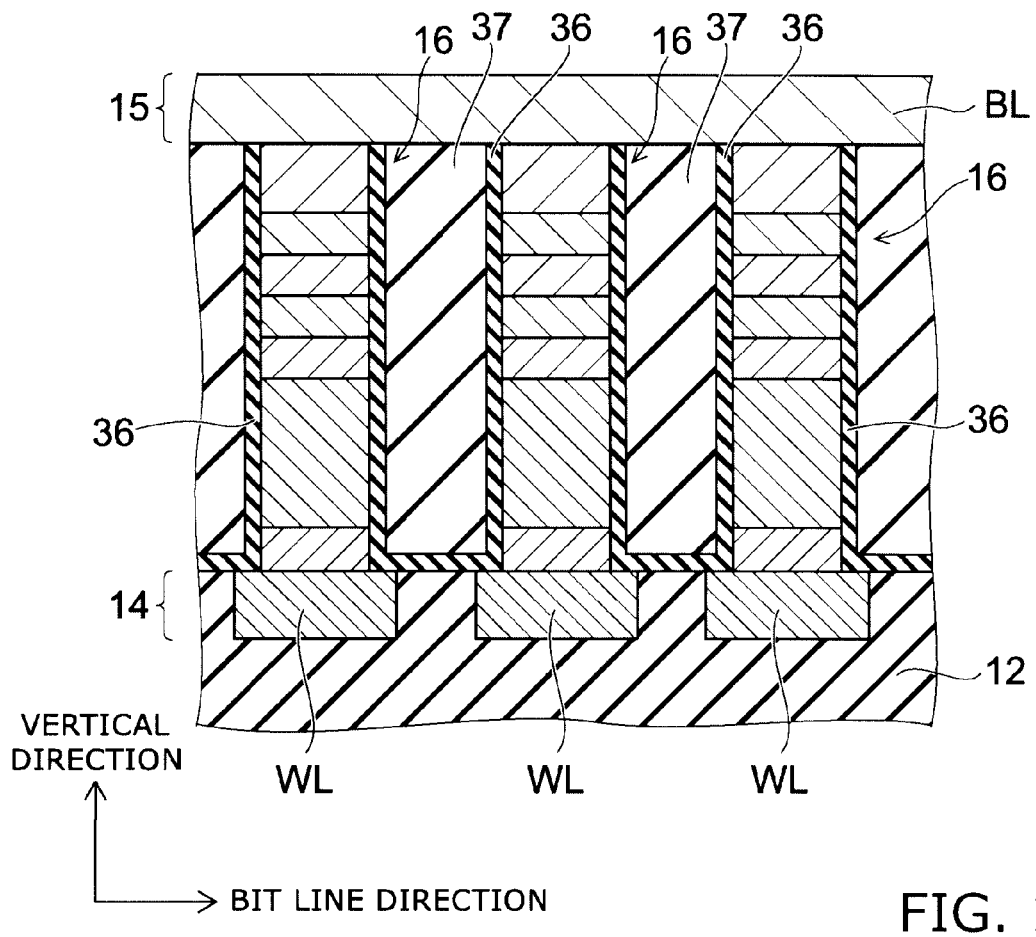

FIGS. 14 to 16 are process sectional views illustrating a method for manufacturing a memory device according to this variation.

First, as shown in FIG. 6, by a method similar to that of the above first embodiment, pillars 16 are formed on the word lines WL.

Next, as shown in FIG. 14, a silicon nitride film 36 is deposited on the entire surface illustratively by an ALD (atomic layer deposition) process. At this time, the temperature is illustratively 350-600° C., and the film thickness of the silicon nitride film 36 is illustratively 1-10 nm. Thus, the exposed region at the upper surface of the interlayer insulating film 12, and the side surface and upper surface of the pillars 16 are covered with the silicon nitride film 36.

Next, as shown in FIG. 15, silicon oxide is deposited by an HDP (high density plasma) process. At this time, to ensure sufficient filling performance, the process of depositing silicon oxide by the HDP process is performed alternately with the process of removing the silicon oxide overhang attached to the upper portion of the pillar 16 by plasma etching with a mixed gas of $NF_3$ gas and $O_2$ gas. Because the side surface of the pillar 16 is covered with the silicon nitride film 36, the intermediate electrode film 23 made of TiSiN is not oxidized by being exposed to the oxygen plasma in the aforementioned plasma etching process. Next, the upper surface is planarized by CMP. Thus, an interlayer insulating film 37 is buried between the pillars 16. Furthermore, at this time, the silicon nitride film 36 is removed from above the upper surface of the pillars 16.

Subsequently, by a method similar to that of the above first embodiment, the memory device is manufactured. More specifically, as shown in FIG. 16, bit lines BL are formed on the pillars 16. Then, after a word line wiring layer 14, a plurality of pillars 16, a bit line wiring layer 15, and a plurality of pillars 16 are formed repetitively, high-temperature heat treatment is performed. By this high-temperature heat treatment, water is generated from the interlayer insulating film 37. However, because the side surface of the pillar 16 is covered with the silicon nitride film 36, the intermediate electrode film 23 is not oxidized by this water.

In this variation, the interlayer insulating film 37 burying the pillars 16 is formed by the HDP process, which is superior in filling performance. This can fill the space between the pillars 16 having a higher aspect ratio than those in the case where the interlayer insulating film 17 is formed by the CVD process using TEOS as a raw material. Furthermore, because the silicon nitride film 36 is formed so as to cover the side surface of the pillar 16, the intermediate electrode film 23 made of TiSiN is not oxidized in the plasma etching and high-temperature heat treatment. Here, if the silicon nitride film 36 is not provided, oxidation of the intermediate electrode film 23 proceeds by approximately 30 nm from the exposed surface. Hence, if the width of the pillar 16 is illustratively 60 nm or less, the intermediate electrode film 23 is entirely oxidized and results in an open defect.

The configuration and the function and effect of this variation other than the foregoing are similar to those of the above first embodiment. Here, the interlayer insulating film 37 may be formed by applying polysilazane (PSZ) by a coating process instead of depositing silicon oxide by the HDP process. This can also achieve good filling performance. Forming the interlayer insulating film 37 by the coating process does not need etching for removing overhangs, but water is generated in the high-temperature heat treatment as in the case of the HDP process. Hence, it is still preferable to form the silicon nitride film 36. Furthermore, instead of forming the silicon nitride film 36 by the ALD process, it is also possible to nitridize the side surface of the pillar 16 by $NH_3$ plasma treatment.

Next, a second embodiment of the invention is described.

Figure 17:
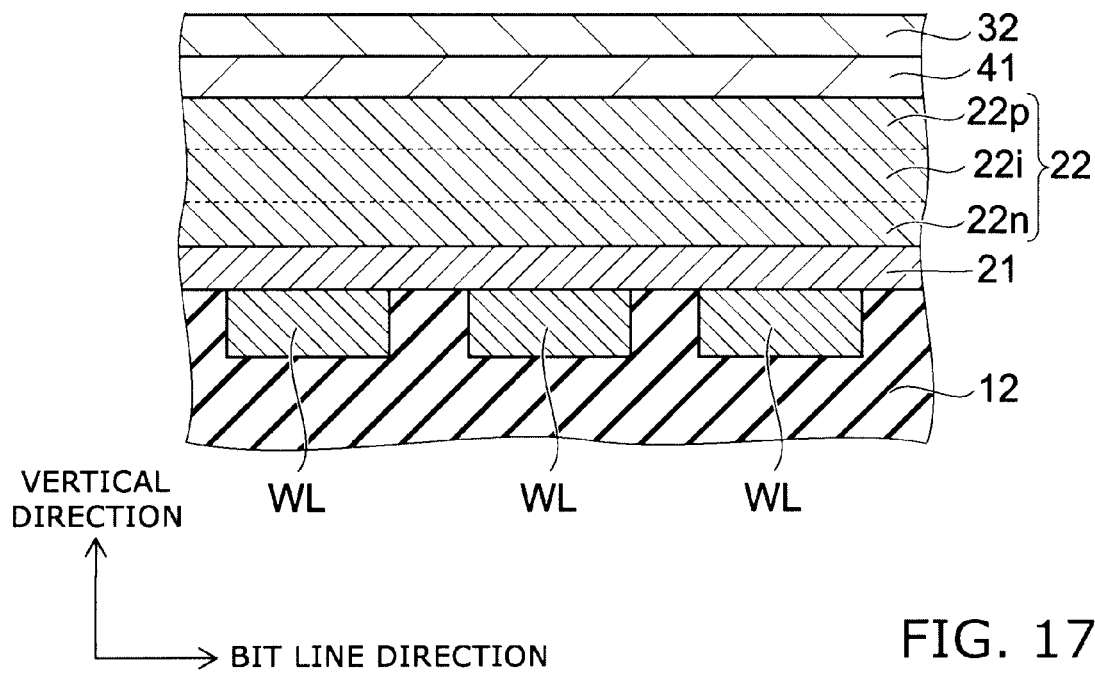
FIG. 17 is a process sectional view illustrating a method for manufacturing a memory device according to a second embodiment.

FIG. 17 is a process sectional view illustrating a method for manufacturing a memory device according to this embodiment.

As shown in FIG. 17, this embodiment is different from the above first embodiment in that instead of the titanium layer 31 (see FIG. 4), a titanium-rich titanium nitride layer 41 is formed on the silicon diode 22. The titanium-rich titanium nitride layer 41 is formed from titanium-rich (Ti-rich) titanium nitride (TiN), and has a thickness of e.g. 1-3 nm. Here, the titanium-rich titanium nitride is a compound represented by chemical formula $Ti_xN_y$, where $x>y$. The composition of the titanium-rich titanium nitride layer 41 can be controlled by controlling the flow rate ratio of nitrogen gas at the time of film formation. Then, a titanium nitride layer 32 is formed on the titanium-rich titanium nitride layer 41. The subsequent process is similar to that of the above first embodiment. More specifically, by performing low-temperature heat treatment, into the titanium-rich titanium nitride layer 41, silicon is diffused from the silicon diode 22, and nitrogen is diffused from the titanium nitride layer 32. Thus, an intermediate electrode film 23 made of TiSiN is formed, and the remaining portion of the titanium nitride layer 32 constitutes a barrier metal 24. At this time, the film thickness of the intermediate electrode film 23 is illustratively 1-5 nm. Then, after the structure as shown in FIG. 1 is fabricated, high-temperature heat treatment is performed to crystallize the silicon diode 22 and activate impurity.

In this embodiment, by depositing titanium-rich titanium nitride on the silicon diode 22, titanium can be coupled to silicon to form a TiSiN film having low interfacial resistance. Furthermore, aggregation of titanium silicide ($TiSi_2$) can be suppressed more effectively than in the case of depositing elemental titanium on the silicon diode 22 as in the first embodiment.

The configuration, the manufacturing method, and the function and effect of this embodiment other than the foregoing are similar to those of the above first embodiment. Also in this embodiment, as in the above first embodiment, the metal is not limited to titanium. However, to reduce the upper surface of the silicon diode 22, it is preferable to use a metal having a larger amount of decrease in the Gibbs free energy associated with oxidation reaction than silicon, or having a larger amount of heat absorption associated with oxidation reaction than silicon. For instance, it is possible to use tantalum, niobium, hafnium, zirconium, or chromium, or an alloy of these metals with tungsten. For instance, it is possible to form a tantalum-rich tantalum nitride layer on the silicon diode 22, form a tantalum nitride layer thereon, and subsequently perform low-temperature heat treatment.

The invention has been described with reference to the embodiments and the variations thereof. However, the invention is not limited to these embodiments and variations. The above embodiments and variations can be practiced in combination with each other. Furthermore, those skilled in the art can suitably modify the above embodiments or variations by addition, deletion, or design change of components, or by addition, omission, or condition change of processes, and such modifications are also encompassed within the scope of the invention as long as they fall within the spirit of the invention.

For instance, in the above first and second embodiment, the titanium nitride layer 32 is illustratively allowed to remain also after the low-temperature heat treatment to form a barrier metal 24 made of titanium nitride (TiN). However, the invention is not limited thereto. For instance, the titanium nitride layer 32 may be completely reacted to omit formation of the barrier metal 24.

In the above first embodiment, a titanium layer 31 is illustratively formed on the silicon diode 22, and in the above second embodiment, a titanium-rich titanium nitride layer 41 is illustratively formed on the silicon diode 22. However, the invention is not limited thereto. For instance, a titanium layer 31 and a titanium-rich titanium nitride layer 41 may be stacked on the silicon diode 22, and a titanium nitride layer 32 may be formed thereon.

Furthermore, in the above first embodiment, titanium nitride is illustratively deposited on the titanium layer 31 to form a titanium nitride layer 32. However, the invention is not limited thereto. After film formation of the titanium layer 31, without exposure to the ambient air, a titanium nitride layer 32 may be formed in the upper portion of the titanium layer 31 by exposure to a nitrogen gas ($N_2$ gas) atmosphere.

Moreover, in the above first and second embodiment, for instance, after the structure made of the word line wiring layers 14, bit line wiring layers 15, and pillars 16 is fabricated, high-temperature heat treatment is collectively performed to crystallize silicon and activate impurity. However, the invention is not limited thereto. For instance, after film formation of the silicon diode 22 in each layer and before film formation of the titanium layer 31 and the like, high-temperature heat treatment, such as annealing at a temperature of 700-900° C. for a duration of 3-80 seconds, may be performed. That is, high-temperature heat treatment may be performed at the timing for forming each pillar layer. In this case, high-temperature heat treatment is performed as many times as the number of stacked pillar layers.

This makes it possible to crystallize the silicon diode 22 before patterning it into a pillar shape. Hence, crystallization is easier than in the case of crystallization after patterning into a pillar shape. More specifically, crystallization of the silicon diode 22 starts to proceed at a portion serving as a crystal nucleus. However, after being processed into a fine pillar shape, it is more likely that a crystal nucleus is not included in each pillar, which makes it difficult to crystallize the silicon diode 22 in all the pillars. In contrast, if the silicon diode 22 is crystallized before patterning, it is almost certain that a crystal nucleus is included in any portion of the silicon diode 22 constituting a continuous film, which facilitates crystallization. Consequently, it is possible to decrease the temperature or duration of heat treatment for crystallization (high-temperature heat treatment).

Moreover, in the above first and second embodiment, the silicon diode 22 is illustratively formed by depositing amorphous silicon while introducing impurity. However, the invention is not limited thereto. For instance, a silicon layer may be deposited without introduction of impurity, and then impurity may be ion-implanted. For instance, film formation of the first-layer silicon layer may be followed by ion implantation of arsenic (As), and film formation of the second-layer silicon layer may be followed by ion implantation of boron (B). Alternatively, film formation of the first-layer silicon layer may be followed by ion implantation of boron, and film formation of the second-layer silicon layer may be followed by ion implantation of arsenic. Furthermore, a non-doped silicon layer may be formed between the first layer and the second layer. Furthermore, the I-type layer 22i may be replaced by a low-concentration layer having a lower effective impurity concentration than the N-type layer 22n and the P-type layer 22p. Furthermore, a P⁻-type layer or an N⁻-type layer having slightly lower impurity concentration may be formed in the upper portion of the P-type layer 22p or the N-type layer 22n constituting the top layer of the silicon diode 22.

Moreover, in the above first and second embodiment, the silicon diode 22 is illustratively formed from impurity-containing silicon. However, the silicon diode 22 only needs to be formed from a semiconductor material primarily composed of silicon, such as silicon-excessive silicon germanium or silicon-excessive silicon carbon.

Moreover, in the above first and second embodiment, the silicon diode 22 is illustratively a PIN diode. However, the invention is not limited thereto, but it only needs to be a diode in which at least the upper portion is made of a silicon-containing semiconductor material, such as a MIS (metal-insulator-silicon) diode or SIS (silicon-insulator-silicon) diode.

The embodiments described above can realize a memory device having low contact resistance between the silicon diode and the electrode film, and a method for manufacturing the same.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A memory device comprising:
a silicon diode, at least an upper portion of the silicon diode being made of a semiconductor material containing silicon and doped with impurity;
an electrode film provided on the silicon diode, being in contact with the silicon diode, and containing a metal, silicon, and nitrogen; and
a resistance change film provided below the silicon diode or above the electrode film,
the electrode film having higher silicon concentration in a lower surface of the electrode film than in an upper surface of the electrode film, and having higher nitrogen concentration in the upper surface than in the lower surface.

2. The device according to claim 1, wherein a decrease amount of Gibbs free energy associated with oxidation reaction of the metal is larger than a decrease amount of Gibbs free energy associated with oxidation reaction of silicon.

3. The device according to claim 1, wherein a heat absorption amount associated with oxidation reaction of the metal is larger than a heat absorption amount associated with oxidation reaction of silicon.

4. The device according to claim 1, wherein the metal is one metal selected from the group consisting of titanium, tantalum, niobium, hafnium, zirconium, and chromium, or an alloy of the one metal with tungsten.

5. The device according to claim 1, further comprising:
a metal nitride layer provided on the electrode film and containing the metal and nitrogen,
the resistance change film being located on the metal nitride layer.

6. The device according to claim 1, further comprising:
a word line wiring layer made of a plurality of word lines extending in a first direction; and
a bit line wiring layer made of a plurality of bit lines extending in a second direction crossing the first direction,
the word line wiring layer and the bit line wiring layer being alternately stacked, and
a pillar having the silicon diode, the electrode film, and the resistance change film, the silicon diode, the electrode film, and the resistance change film being stacked, the pillar being formed between each of the word lines and each of the bit lines.

* * * * *